(12) United States Patent
Murofushi

(10) Patent No.: US 9,520,518 B2
(45) Date of Patent: Dec. 13, 2016

(54) SOLAR CELL MODULE

(71) Applicant: MITSUI CHEMICALS TOHCELLO, INC., Chiyoda-ku (JP)

(72) Inventor: Takanobu Murofushi, Hitachinaka (JP)

(73) Assignee: MITSUI CHEMICALS TOHCELLO, INC., Tokyo (JP)

( * ) Notice: Subject to any disclaimer, the term of this patent is extended or adjusted under 35 U.S.C. 154(b) by 0 days.

(21) Appl. No.: 14/401,665

(22) PCT Filed: May 15, 2013

(86) PCT No.: PCT/JP2013/003084
§ 371 (c)(1),
(2) Date: Nov. 17, 2014

(87) PCT Pub. No.: WO2013/172023
PCT Pub. Date: Nov. 21, 2013

(65) Prior Publication Data
US 2015/0144193 A1 May 28, 2015

(30) Foreign Application Priority Data

May 16, 2012 (JP) ................. 2012-112234

(51) Int. Cl.
| | | |
|---|---|---|
| *H01L 31/042* | (2014.01) | |
| *H01L 31/048* | (2014.01) | |
| *C08K 5/3475* | (2006.01) | |
| *C08K 5/134* | (2006.01) | |
| *H02S 20/23* | (2014.01) | |
| *H01L 31/049* | (2014.01) | |
| *C08L 23/08* | (2006.01) | |

(52) U.S. Cl.
CPC .......... *H01L 31/0481* (2013.01); *C08K 5/134* (2013.01); *C08K 5/3475* (2013.01); *H01L 31/048* (2013.01);
(Continued)

(58) Field of Classification Search
CPC .................... H01L 31/048–31/0488
(Continued)

(56) References Cited

U.S. PATENT DOCUMENTS

| | | |
|---|---|---|
| 6,153,823 A | 11/2000 | Shiozaki et al. |
| 2001/0054437 A1 | 12/2001 | Komori et al. |

(Continued)

FOREIGN PATENT DOCUMENTS

| | | |
|---|---|---|
| JP | 8-139347 A | 5/1996 |
| JP | 10-93124 A | 4/1998 |

(Continued)

OTHER PUBLICATIONS

English translation of Kinri et al. Japanese publication No. 2008/235610.*

(Continued)

*Primary Examiner* — Allison Bourke
*Assistant Examiner* — Niki Bakhtiari
(74) *Attorney, Agent, or Firm* — Buchanan, Ingersoll & Rooney PC

(57) ABSTRACT

Provided is a solar cell module wherein a rear surface protective sheet has excellent long-term durability, and transmissivity of ultraviolet that reaches the solar cell is retained for a long time. This solar cell module is configured by laminating a front surface protective sheet, a light receiving-side sealing sheet, a solar cell element, a rear surface-side sealing sheet, and a rear surface protective sheet in this order. The solar cell module is characterized in that the light receiving-side sealing sheet has a transmissivity of 50% or more with respect to light having a wavelength of 300 nm, and the rear surface-side sealing sheet contains a reactive ultraviolet absorbent.

4 Claims, 1 Drawing Sheet

(52) U.S. Cl.
CPC ............. *H01L 31/049* (2014.12); *H02S 20/23* (2014.12); *C08L 23/08* (2013.01); *Y02B 10/12* (2013.01); *Y02E 10/50* (2013.01)

(58) Field of Classification Search
USPC .................................................. 136/243–265
See application file for complete search history.

(56) References Cited

U.S. PATENT DOCUMENTS

| | | | |
|---|---|---|---|
| 2006/0201545 A1* | 9/2006 | Ovshinsky et al. ......... | 136/251 |
| 2011/0223419 A1* | 9/2011 | Okawara et al. ...... | 428/355 EN |
| 2012/0097220 A1 | 4/2012 | Miyashita et al. | |
| 2013/0306127 A1* | 11/2013 | Ackermann ............. | F24J 2/085 136/242 |

FOREIGN PATENT DOCUMENTS

| | | |
|---|---|---|
| JP | 10-256575 A | 9/1998 |
| JP | 2006-066682 A | 3/2006 |
| JP | 2008-235610 A | 10/2008 |
| JP | 2011-044690 A | 3/2011 |
| JP | 2012-071420 A | 4/2012 |

OTHER PUBLICATIONS

International Search Report (PCT/ISA/210) mailed on Jul. 9, 2013, by the Japanese Patent Office as the International Searching Authority for International Application No. PCT/JP2013/003084.
Green et al., "Solar cell efficiency tables (version 36)", Progress in Photovoltaics: Research and Applications, 2010 (month unknown), pp. 346-352, vol. 18.

* cited by examiner

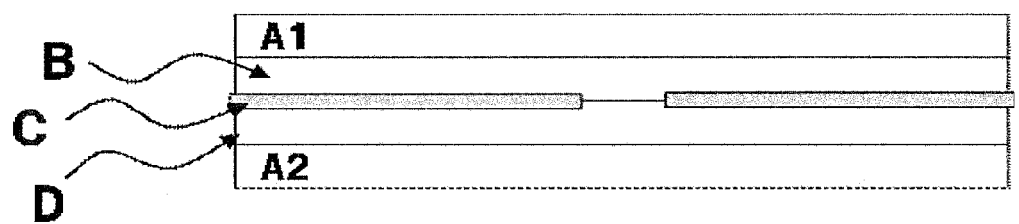

SOLAR CELL MODULE

TECHNICAL FIELD

The present invention relates to a solar cell module.

BACKGROUND ART

With growing concerns about global environmental issues and energy issues, solar batteries have been attracting attention as a clean, sustainable means of energy generation. For outdoor application such as use on the roofs of buildings, the solar batteries are generally used in the form of solar cell modules.

A solar cell module is generally produced by the following procedures: first, for example, either crystalline solar cells made of poly- or mono-crystalline silicon or thin-film solar cells obtained by depositing on substrate (e.g., glass substrate) very thin films of the order of several micrometers in thickness (e.g., amorphous silicon or crystalline silicon films) are produced. Next, in the case of a crystalline solar cell module, a module assembly is constructed in which a solar cell module protective sheet (surface-protective sheet), a light-receiving-side solar cell encapsulation sheet, the crystalline solar cells, a back-side solar cell encapsulation sheet, and a solar cell module protective sheet (rear protective sheet) are sequentially laminated on top of each other. On the other hand, in the case of a thin-film solar cell module, a module assembly is constructed in which the thin-film solar cells, a solar cell encapsulation sheet, and a solar cell module protective sheet (rear protective sheet) are sequentially laminated on top each other.

A solar cell module is then manufactured for example by a vacuum lamination process in which the module layers are laminated together under heat and pressure. Solar cell modules manufactured in this manner exhibit weather resistance, lending themselves to be suitably used in outdoor environment such as on the roofs of buildings.

Such a solar cell module is exposed to sunlight and the elements for a long period and therefore required to have excellent durability. In order to improve the durability of encapsulation sheets, a resin material used is generally mixed with additives such as ultraviolet absorbers, antioxidants, or hindered amine light stabilizers (see, e.g., Patent Literatures 1 and 2).

For improved light use efficiency of solar cells, a solar cell has been developed with enhanced external quantum efficiency for ultraviolet light having a wavelength of 400 nm or 360 nm or lower (see, e.g., Non-Patent Literature 1). In the case of using such a solar cell with enhanced external quantum efficiency for ultraviolet light, ultraviolet light having a wavelength of 360 nm or lower is absorbed by an encapsulation sheet containing an ultraviolet absorber, particularly when the encapsulation sheet is disposed on the light-receiving side. For this reason, ultraviolet light energy cannot be used.

On the other hand, in the absence of the ultraviolet absorber, ultraviolet ray contained in sunlight reaches as far as the rear protective sheet to cause degradation or discoloration of the sheet. PTL 3 has proposed a technique of effectively using ultraviolet light and preventing the discoloration of the rear protective sheet with a configuration wherein the light-receiving-side encapsulation sheet contains a reduced amount of ultraviolet absorber so that the back-side encapsulation sheet contains a higher concentration of ultraviolet absorber than the light-receiving side encapsulation sheet.

CITATION LIST

Patent Literature

PTL 1
Japanese Patent Application Laid-Open No. 8-139347
PTL 2
Japanese Patent Application Laid-Open No. 10-93124
PTL 3
Japanese Patent Application Laid-Open No. 2006-66682

Non-Patent Literature

NPL 1
Prog. Photovolt: Res. Appl. 2010; Vol. 18: Pages 346-352

SUMMARY OF INVENTION

Technical Problem

According to the studies of the present inventors, the technique described in PTL 1 is still insufficiently effective for preventing the degradation and discoloration of the rear protective sheet. According to the studies of the present inventors, the configuration wherein the back-side encapsulation sheet contains a higher concentration of ultraviolet absorber than the light-receiving side encapsulation sheet has been shown to cause time-dependent diffusion migration of the ultraviolet absorber contained in the back-side solar cell encapsulation sheet into the light-receiving-side encapsulation sheet due to concentration difference, particularly when exposed to high temperatures for a long time. As a result, it has been shown that amount of the ultraviolet light that reaches the solar cell decreases.

The present invention has been made in light of the foregoing drawbacks pertinent in the art. An object of the present invention is to provide a solar cell module that is superior in the long-term durability of the rear protective sheet and maintains for a long time the transmittance of ultraviolet light that reaches the solar cell.

Solution to Problem

The present inventors have conducted diligent studies to attain the object and consequently established that use of a reactive ultraviolet absorber in the back-side encapsulation sheet prevents the diffusion migration of the ultraviolet absorber into the light-receiving-side encapsulation sheet and can maintain over a long time the transmittance of ultraviolet light that reaches the solar cell.

The present invention has the following configurations:

[1] A solar cell module including a surface-protective sheet, a light-receiving-side encapsulation sheet, a solar cell element, a back-side encapsulation sheet, and a rear protective sheet laminated in the order presented, in which the light-receiving-side encapsulation sheet has 50% or higher transmittance of light having a wavelength of 300 nm, and the back-side encapsulation sheet contains a reaction product of a reactive ultraviolet absorber and a resin component.

[2] The solar cell module according to [1], in which the reactive ultraviolet absorber contains a reactive functional group having an unsaturated bond.

[3] The solar cell module according to [2], in which the reactive ultraviolet absorber contains a group selected from an acryloyl group, a methacryloyl group, and an allyl group.

[4] The solar cell module according to [2], in which the reactive ultraviolet absorber is at least one compound selected from 2-[2-hydroxy-5-[2-(methacryloyloxy)ethyl] phenyl]-2H-benzotriazole, 2-(4-allyloxy-2-hydroxyphenyl)-2H-benzotriazole, 2-(4-acryloyloxy-2-hydroxyphenyl)-2H-benzotriazole, and 2-(4-benzoyl-3-hydroxyphenoxy)ethyl propenoate.

[5] The solar cell module according to any one of [1] to [4], in which the back-side encapsulation sheet contains a reaction product of an ethylene-polar monomer copolymer or an ethylene-α-olefin copolymer and 0.01 to 0.5 parts by weight of the reactive ultraviolet absorber with respect to 100 parts by weight of the ethylene-polar monomer copolymer or the ethylene-α-olefin copolymer.

Advantageous Effects of Invention

Encapsulation sheets included in a solar cell module of the present invention are excellent in transparency, flexibility, adhesiveness, heat resistance, weather resistance, crosslink characteristics, and extrusion moldability. Particularly, a light-receiving-side encapsulation sheet in the solar cell module of the present invention can maintain transparency over a long period and therefore output is not easily reduced.

BRIEF DESCRIPTION OF DRAWING

FIG. 1 illustrates the configuration of a simulated module used in evaluations.

DESCRIPTION OF EMBODIMENTS

1. Solar Cell Module

A solar cell module of the present invention includes a surface-protective sheet, a light-receiving-side encapsulation sheet, a solar cell element, a back-side encapsulation sheet, and a rear protective sheet laminated in the order presented.

The solar cell element can be any of various solar cell elements such as silicon (monocrystalline silicon, polycrystalline silicon, or amorphous silicon)-based elements and Group III-V or II-VI (e.g., gallium-arsenic, copper-indium-selenium, or cadmium-tellurium) compound semiconductor-based elements.

Examples of materials for the surface-protective sheet constituting the solar cell module can include glass, acrylic resins, polycarbonates, polyesters, and fluororesins. Glass is usually used.

Examples of the rear protective sheet include sheets made of inorganic materials (e.g., metal, glass) or various thermoplastic resins each alone, and multilayer sheets thereof. A sheet or film made of thermoplastic resin is preferred. A sheet or film made of polyester, particularly, polyethylene terephthalate, is more preferred.

1-1. Back-Side Encapsulation Sheet

The back-side encapsulation sheet in the solar cell module contains a reaction product of a raw resin and a reactive ultraviolet absorber. In other words, the back-side encapsulation sheet is a reaction product of a composition containing a raw resin, a reactive ultraviolet absorber, and optional other additives. The back-side encapsulation sheet can be obtained by processing a mixture containing a raw resin, a reactive ultraviolet absorber, and optional other additives into a sheet by extrusion molding or calendar molding.

<Raw Resin>

Examples of the raw resin in the back-side encapsulation sheet include ethylene-polar monomer copolymers and ethylene-α-olefin copolymers. Examples of the ethylene-polar monomer copolymers include ethylene-vinyl acetate copolymers, ethylene-(meth)acrylic acid copolymers, and ethylene-(meth)acrylic acid ester copolymers, with ethylene-vinyl acetate copolymer being preferred.

The content of vinyl acetate in the ethylene-vinyl acetate copolymer is 10 to 47 mass %, preferably 13 to 35 mass %. When the content of vinyl acetate falls within this range, the resulting solar cell encapsulation resin sheet is excellent in the balance among adhesiveness, weather resistance, and transparency. The melt flow rate of the ethylene-vinyl acetate copolymer at 190° C. at a load of 2,160 g (MFR; ASTM D1238) is 5 to 45 g/10 min, more preferably 5 to 40 g/10 min, further preferably 10 to 30 g/10 min. When MFR falls within this range, the raw resin is suitable for melt kneading and extrusion moldability.

Examples of the ethylene-α-olefin copolymers include copolymers of ethylene and α-olefins selected from propylene, 1-butene, 1-pentene, 1-hexene, 4-methyl-1-pentene, and 1-octene. The content of ethylene is in the range of 75 to 95 mol %, preferably 80 to 90 mol %. When the content of ethylene falls within this range, the resulting sheet is excellent in flexibility for protection of the solar cell as well as adhesiveness, weather resistance, and transparency.

The density of the ethylene-α-olefin copolymer is usually 0.920 to 0.880 g/cm$^3$, preferably 0.865 to 0.884 g/cm$^3$, more preferably 0.866 to 0.883 g/cm$^3$. The density can be adjusted by the ethylene-α-olefin compositional ratio.

MFR (ASTM D1238, 190° C., 2.16 kg load) of the ethylene-α-olefin copolymer is preferably 1 g/10 min to 50 g/10 min. When the sheet production process is extrusion molding, MFR of the ethylene-α-olefin copolymer is 10 to 50 g/10 min, preferably 10 to 30 g/10 min. When the sheet production process is calendar molding, MFR of the ethylene-α-olefin copolymer is 1 g/10 min or higher and lower than 10 g/10 min, preferably higher than 2 g/10 min and lower than 10 g/10 min.

<Reactive Ultraviolet Absorber>

The reactive ultraviolet absorber preferably contains a benzotriazole skeleton, a benzophenone skeleton, a cyano acrylate skeleton, or a salicylic acid skeleton in its molecule.

More preferably, the reactive ultraviolet absorber has a benzotriazole skeleton and a benzophenone skeleton in the molecule.

The reactive ultraviolet absorber used in the present invention has a reactive functional group in addition to the above-mentioned skeleton in its molecule. The reactive functional group preferably has an unsaturated bond. Examples of the unsaturated bond include unsaturated groups having a carbon-carbon double bond to be added to the polymer backbone. The reactive functional group is preferably an acryloyl group, a methacryloyl group, or an allyl group.

Specific examples of the reactive ultraviolet absorber include 2-[2-hydroxy-5-[2-(methacryloyloxy)ethyl]phenyl]-2H-benzotriazole, 2-(4-allyloxy-2-hydroxyphenyl)-2H-benzotriazole, 2-(4-acryloyloxy-2-hydroxyphenyl)-2H-benzotriazole, and 2-(4-benzoyl-3-hydroxyphenoxy)ethyl propenoate. One of these compounds may be used alone, or two or more thereof may be used in combination.

The reactive ultraviolet absorber is preferably used in an amount of 0.01 to 0.5 parts by weight with respect to 100 parts by weight of the raw resin; 0.01 parts by weight or larger is preferred because degradation or discoloration of the rear protective sheet can be prevented, and 0.5 parts by weight or smaller is preferred from the perspective of transparency and/or hue.

At least a portion of the reactive ultraviolet absorber reacts with a resin material (including the raw resin) constituting the back-side encapsulation sheet. As a result, the ultraviolet absorber can be prevented from migrating in the back-side encapsulation sheet and can thereby be prevented from diffusing into the light-receiving-side encapsulation sheet. For the back-side encapsulation sheet, it is only required that at least a portion of the reactive ultraviolet absorber should form a chemical bond with the resin material. The reactive ultraviolet absorber may react with the molecular backbone of the resin material or may react with a polar group, a pendant group, in the ethylene-polar monomer copolymer.

The reactive ultraviolet absorber preferably contains an unsaturated group having a carbon-carbon double bond, more preferably a group such as an acryloyl group or a methacryloyl group, and preferably, the reactive ultraviolet absorber and the resin component are melt-kneaded in the presence of a peroxide to thereby graft the reactive ultraviolet absorber to the resin material for the back-side encapsulation sheet. Preferably, 0.01 to 1% of peroxide is used for grafting the reactive ultraviolet absorber during module production.

1-2. Light-Receiving-Side Encapsulation Sheet

The light-receiving-side encapsulation sheet in the solar cell module has transmittance of light having a wavelength of 300 nm in the range of 50% or higher. The transmittance of light having a wavelength of 300 nm can be measured using a spectrophotometer (SolidSpec-3700DUV manufactured by Shimadzu Corp.). The light having a wavelength of 300 nm is preferably incident perpendicularly to the surface of the sheet.

The light-receiving-side encapsulation sheet preferably contains the same raw resin as that for the back-side encapsulation sheet, i.e., the above-mentioned ethylene-polar monomer copolymer or ethylene-α-olefin copolymer.

The light-receiving-side encapsulation sheet may further contain an ultraviolet absorber, the content of which is preferably 0.02% or smaller. Specifically, the content of an ultraviolet absorber selected from benzotriazole-based, benzophenone-based, cyano acrylate-based, and salicylic acid-based ultraviolet absorbers is set to preferably 0.02% or smaller, more preferably 0.01% or smaller, for allowing the light-receiving-side encapsulation sheet to have 50% or higher transmittance of light having a wavelength of 300 nm. When the transmittance of light having a wavelength of 300 nm is 50% or higher, light in the ultraviolet region included in sunlight advantageously reaches the solar cell for effective energy utilization.

1-3. Additives Contained in Back-Side Encapsulation Sheet and Light-Receiving-Side Encapsulation Sheet Each of the light-receiving-side and/or back-side encapsulation sheets in the solar cell module may be a reaction product of a composition containing an additive known in the art as given below in addition to the raw resin. The content of the additive in the composition is preferably 0.005 to 5 parts by weight with respect to 100 parts by weight of the raw resin (typically, ethylene-polar monomer copolymer or ethylene-α-olefin copolymer).

(Organic Peroxide)

The organic peroxide may act as a radical initiator for the graft modification of the ethylene-polar monomer copolymer or the ethylene-α-olefin copolymer with the reactive ultraviolet absorber and/or an ethylenically unsaturated silane compound mentioned later. The graft modification of the ethylene-α-olefin copolymer with the ethylenically unsaturated silane compound provides a solar cell module having favorable adhesiveness to glass, a back sheet, a cell, and an electrode.

The organic peroxide may also act as a radical initiator for the cross-linking reaction of the resin component during the lamination process for a solar cell module. The cross-linking of the ethylene-polar monomer copolymer or the ethylene-α-olefin copolymer can provide a solar cell module excellent in heat resistance and adhesiveness.

The organic peroxide is preferably an organic peroxide having a one-minute half-life temperature of 100 to 170° C. from the perspective of the balance between sheet productivity by extrusion sheet molding and the graft modification or cross-linking rate during the lamination process for a solar cell module. When the one-minute half-life temperature of the organic peroxide is 100° C. or higher, a solar cell encapsulation sheet to be obtained from the resin composition during extrusion sheet molding can be prevented from being gelled. When the one-minute half-life temperature of the organic peroxide is 170° C. or lower, the cross-linking rate during the lamination process is moderate to offer excellent productivity of the solar cell module. In addition, the resulting solar cell encapsulant also maintain favorable heat resistance and adhesiveness.

Specific examples of the preferred organic peroxide having a one-minute half-life temperature in the range of 100 to 170° C. include dilauroyl peroxide, 1,1,3,3-tetramethylbutyl peroxy-2-ethylhexanoate, dibenzoyl peroxide, t-amyl peroxy-2-ethylhexanoate, t-butyl peroxy-2-ethylhexanoate, t-butyl peroxyisobutyrate, t-butylperoxymaleic acid, 1,1-di(t-amylperoxy)-3,3,5-trimethylcyclohexane, 1,1-di(t-amylperoxy)cyclohexane, t-amyl peroxyisononanoate, t-amyl peroxy-normal octoate, 1,1-di(t-butylperoxy)-3,3,5-trimethylcyclohexane, 1,1-di(t-butylperoxy)cyclohexane, t-butyl peroxyisopropylcarbonate, t-butyl peroxy-2-ethylhexylcarbonate, 2,5-dimethyl-2,5-di(benzoylperoxy)hexane, t-amyl peroxybenzoate, t-butyl peroxyacetate, t-butyl peroxyisononanoate, 2,2-di(t-butylperoxy)butane, and t-butyl peroxybenzoate. Preferred examples thereof include dilauroyl peroxide, t-butyl peroxyisopropylcarbonate, t-butyl peroxyacetate, t-butyl peroxyisononanoate, t-butyl peroxy-2-ethylhexylcarbonate, and t-butyl peroxybenzoate.
(Crosslinking Promoter)

Use of a crosslinking promoter can promote cross-linking reaction during the lamination process for solar cell module and thereby enhance heat resistance or long-term durability of the resultant solar cell module. Examples of crosslinking promoters include allyl group-containing compounds such as triallyl isocyanurate and trimethallyl isocyanurate.
(Ethylenically Unsaturated Silane Compound)

The ethylenically unsaturated silane compound that may be contained in the sheets is not particularly limited, and any of the compounds known in the art can be used. Specifically, vinyltriethoxysilane, vinyltrimethoxysilane, vinyltris(β-methoxyethoxysilane), γ-glycidoxypropyltrimethoxysilane, γ-aminopropyltriethoxysilane, γ-methacryloxypropyltrimethoxysilane, or the like can be used. Preferred examples thereof include γ-glycidoxypropyltrimethoxysilane, γ-aminopropyltriethoxysilane, γ-methacryloxypropyltrimethoxysilane, and vinyltriethoxysilane, which tend to enhance the adhesiveness of the sheets.
(Light Stabilizer)

The light stabilizer that may be contained in the sheets is preferably, for example, a hindered amine or hindered piperidine compound such as bis(2,2,6,6-tetramethyl-4-piperidyl)sebacate or poly[{6-(1,1,3,3-tetramethylbutyl)amino-1,3,5-triazine-2,4-diyl}{(2,2,6,6-tetramethyl-4-piperidyl)imino}hexamethylene{(2,2,6,6-tetramethyl-4-piperidyl)imino}].
(Thermal Stabilizer)

Examples of the thermal stabilizer that may be contained in the sheets include: phosphite-based thermal stabilizers such as tris(2,4-di-tert-butylphenyl)phosphite, bis[2,4-bis(1,1-dimethylethyl)-6-methylphenyl]ethyl ester phosphorous acid ester, tetrakis(2,4-di-tert-butylphenyl)[1,1-biphenyl]-4,4'-diylbisphosphonite, and bis(2,4-di-tert-butylphenyl)pentaerythritol diphosphite; lactone-based thermal stabilizers such as a reaction product of 3-hydroxy-5,7-di-tert-butyl-furan-2-one and o-xylene; hindered phenol-based thermal stabilizers such as 3,3',3",5,5',5"-hexa-tert-butyl-a,a',a"-(methylene-2,4,6-triyl)tri-p-cresol, 1,3,5-trimethyl-2,4,6-tris(3,5-di-tert-butyl-4-hydroxyphenyl)benzylbenzene, pentaerythritol tetrakis[3-(3,5-di-tert-butyl-4-hydroxyphenyl)propionate], octadecyl-3-(3,5-di-tert-butyl-4-hydroxyphenyl)propionate, and thiodiethylenebis[3-(3,5-di-tert-butyl-4-hydroxyphenyl)propionate]; sulfur-based thermal stabilizers; and amine-based thermal stabilizers. One of these thermal stabilizers may be used alone, or two or more thereof may be used in combination. Among them, a phosphite-based thermal stabilizer or a hindered phenol-based thermal stabilizer is preferred.

2. Method for Manufacturing Solar Cell Module

One exemplary method for manufacturing a solar cell module involves heating a laminate including a surface-protective sheet, a light-receiving-side precursor encapsulation sheet, a solar cell element, a back-side precursor encapsulation sheet, and a rear protective sheet laminated in the order presented, for pre-bonding. Heating for pre-bonding can be carried out by heating of the resin compositions of the precursor encapsulation sheets in the laminate at a temperature that melts the resin compositions (including an ethylene-polar monomer copolymer or an ethylene-α-olefin copolymer) without substantially decomposing the organic peroxide that may be contained in the light-receiving-side precursor encapsulation sheet and the back-side precursor encapsulation sheet.

The temperature of the laminate after pre-bonding is then elevated to sufficiently bond each member to the light-receiving-side precursor encapsulation sheet and to the back-side precursor encapsulation sheet. In the resin composition of the back-side precursor encapsulation sheet, the reactive functional group of the reactive ultraviolet absorber is reacted with the resin component while the resin component is cross-linked through reaction. The heating temperature for bonding and cross-linking may be at a level that causes the reaction of the reactive ultraviolet absorber, yields a satisfactory cross-linking rate, and does not swell the sheet. The temperature can be in the range of, for example, approximately 100 to 180° C.

The light-receiving-side precursor encapsulation sheet and the back-side precursor encapsulation sheet can be obtained by the sheet molding of raw resins as follows: the raw resins (preferably an ethylene-polar monomer copolymer or an ethylene-α-olefin copolymer) of the light-receiving-side precursor encapsulation sheet and the back-side precursor encapsulation sheet are each dry-blended in advance with an organic peroxide and further with optional other additives (including the reactive ultraviolet absorber). Each dry blend can be supplied from the hopper of an extruder and extrusion-molded into a sheet at a temperature that does not decompose the organic peroxide, to provide the light-receiving-side precursor encapsulation sheet and the back-side precursor encapsulation sheet.

The light-receiving-side precursor encapsulation sheet and the back-side precursor encapsulation sheet can also be obtained by calendar molding.

The molding can be carried out by a method known in the art using a T-die extruder, a calendar molding machine, an inflation molding machine, or the like.

Alternatively, a sheet preliminarily free from an organic peroxide may be prepared by the above-mentioned method, and the organic peroxide can be added to the prepared sheet by an impregnation method.

The sheet thicknesses of the light-receiving-side precursor encapsulation sheet and the back-side precursor encapsulation sheet are usually 0.01 to 2 mm, preferably 0.05 to 1.5 mm, more preferably 0.1 to 1.2 mm. The sheets each having a sheet thickness within this range can prevent glass, solar cell elements, thin-film electrodes and the like from being damaged during the lamination step and can secure sufficient light transmittance.

EXAMPLES

Example 1

For a composition for light-receiving-side encapsulation sheet (B), 100 parts by mass of an ethylene-vinyl acetate copolymer (vinyl acetate content: 28 wt %) were mixed with 0.1 parts by mass of 2,5-dimethyl-2,5-bis(t-butylperoxy)hexane, 0.4 parts by mass of t-butyl peroxy-2-ethylhexylcarbonate, 1.0 part by mass of triallyl isocyanurate, and 0.2 parts by mass of γ-methacryloxypropyltrimethoxysilane to afford a resin composition.

The obtained resin composition was extrusion-molded into a sheet of the composition for light-receiving-side encapsulation sheet (B) (also referred to as a "light-receiving-side precursor encapsulation sheet") having a thickness of approximately 600 μm using an extruder with a T-die. The sheet of the composition for light-receiving-side encapsulation sheet (B) had 67% transmittance of light having a wavelength of 300 nm.

For a composition for back-side encapsulation sheet (D), 100 parts by mass of an ethylene-vinyl acetate copolymer (vinyl acetate content: 28 wt %) were mixed with 0.1 parts by mass of 2,5-dimethyl-2,5-bis(t-butylperoxy)hexane, 0.4 parts by mass of t-butyl peroxy-2-ethylhexylcarbonate, 1.0 part by mass of triallyl isocyanurate, 0.2 parts by mass of γ-methacryloxypropyltrimethoxysilane, and 0.3 parts by mass of a reactive ultraviolet absorber 2-[2-hydroxy-5-[2-(methacryloyloxy)ethyl]phenyl]-2H-benzotriazole to afford a resin composition.

The obtained resin composition was extrusion-molded into a sheet of the composition for back-side encapsulation sheet (D) (also referred to as a "back-side precursor encapsulation sheet") having a thickness of approximately 600 μm using an extruder with a T-die, as with light-receiving-side encapsulation sheet (B).

The obtained sheet of the composition for light-receiving-side encapsulation sheet (B) and sheet of the composition for back-side encapsulation sheet (D) were laminated, as shown in FIG. 1, with a pair of glass sheets (A1 and A2) and aluminum sheet (C). Vacuum lamination was carried out at 150° C. for 15 minutes to afford a test specimen.

The obtained test specimen was exposed to an oven of 120° C. for 500 hours. The reflectivity of the aluminum sheet for light (wavelength: 350 nm) incident from the A1 side of the test specimen was measured before and after the exposure using a spectrophotometer (SolidSpec-3700DUV manufactured by Shimadzu Corp.). The measurement was performed at a position 10 mm apart from the opening of aluminum sheet (C).

The change in reflectivity between before and after the exposure, i.e., the change in reflectivity from the initial value after the exposure for 500 hours, was determined. The change in reflectivity represents the degree of diffusion of the ultraviolet absorber from back-side encapsulation sheet (D) into light-receiving-side encapsulation sheet (B). Specifically, the diffusion of the ultraviolet absorber was evaluated on the basis of the change in reflectivity. The evaluation results are shown in Table 1.

In addition, only light-receiving-side encapsulation sheet (B) was heated in vacuum at 150° C. for 15 minutes, and its transmittance of light having a wavelength of 300 nm was measured. As a result, the light-receiving-side sheet had 50% or higher transmittance. Light-receiving-side encapsulation sheets (B) of other Examples and Comparative Examples also had 50% or higher transmittance of light having a wavelength of 300 nm in the same measurement as above.

Example 2

A sheet of the composition for back-side encapsulation sheet (D) was prepared in totally the same way as in Example 1 except that the ultraviolet absorber was changed to 2-(4-allyloxy-2-hydroxyphenyl)-2H-benzotriazole. The diffusion of the ultraviolet absorber was evaluated in the same way as in Example 1 using this sheet of the composition for back-side encapsulation sheet (D). The evaluation results are shown in Table 1.

Example 3

A sheet of the composition for back-side encapsulation sheet (D) was prepared in totally the same way as in Example 1 except that the ultraviolet absorber was changed to 2-(4-acryloyloxy-2-hydroxyphenyl)-2H-benzotriazole. The diffusion of the ultraviolet absorber was evaluated in the same way as in Example 1 using the sheet of the composition for back-side encapsulation sheet (D). The evaluation results are shown in Table 1.

Example 4

A sheet of the composition for back-side encapsulation sheet (D) was prepared in totally the same way as in Example 1 except that the ultraviolet absorber was changed to 2-(3-benzoyl-3-hydroxyphenoxy)ethyl propenoate. The diffusion of the ultraviolet absorber was evaluated in the same way as in Example 1 using the sheet of the composition for back-side encapsulation sheet (D). The evaluation results are shown in Table 1.

Example 5

For a composition for light-receiving-side encapsulation sheet (B), 100 parts by mass of an ethylene-α-olefin copolymer (density: 870 kg/m³, MFR: 20 g/10 min at 190° C., 2.16 kg load) were mixed with 0.1 parts by mass of 2,5-dimethyl-2,5-bis(t-butylperoxy)hexane, 0.5 parts by mass of t-butyl peroxy-2-ethylhexylcarbonate, 1.0 part by mass of triallyl isocyanurate, and 0.2 parts by mass of γ-methacryloxypropyltrimethoxysilane to afford a resin composition.

The obtained resin composition was extrusion-molded into a sheet of the composition for light-receiving-side encapsulation sheet (B) having a thickness of approximately 600 μm using an extruder with a T-die. The transmittance of light having a wavelength of 300 nm was 69%.

For a composition for back-side encapsulation sheet (D), 100 parts by mass of an ethylene-α-olefin copolymer (density: 870 kg/m$^3$, MFR: 20 g/10 min at 190° C., 2.16 kg load) were mixed with 0.1 parts by mass of 2,5-dimethyl-2,5-bis (t-butylperoxy)hexane, 0.5 parts by mass of t-butyl peroxy-2-ethylhexylcarbonate, 1.0 part by mass of triallyl isocyanurate, 0.2 parts by mass of γ-methacryloxypropyltrimethoxysilane, and 0.3 parts by mass of a reactive ultraviolet absorber 2-[2-hydroxy-5-[2-(methacryloyloxy)ethyl]phenyl]-2H-benzotriazole to afford a resin composition.

The obtained resin composition was extrusion-molded into a sheet of the composition for back-side encapsulation sheet (D) having a thickness of approximately 600 μm using an extruder with a T-die, as with the sheet of the composition for light-receiving-side encapsulation sheet (B).

The obtained sheet of the composition for light-receiving-side encapsulation sheet (B) and sheet of the composition for back-side encapsulation sheet (D) were laminated, as shown in FIG. 1, with glass sheets (A1 and A2) and aluminum sheet (C). Vacuum lamination was carried out at 150° C. for 15 minutes.

The obtained test specimen was exposed to an oven of 120° C. for 500 hours. The reflectivity of the aluminum sheet for light (wavelength: 350 nm) incident from the A1 side of the test specimen was measured before and after the exposure using a spectrophotometer (SolidSpec-3700DUV manufactured by Shimadzu Corp.). The measurement was performed at a position 10 mm apart from the opening of aluminum sheet (C).

The change in reflectivity between before and after the exposure, i.e., the change in reflectivity from the initial value after the exposure for 500 hours, was determined. The change in reflectivity represents the degree of diffusion of the ultraviolet absorber from back-side encapsulation sheet (D) into light-receiving-side encapsulation sheet (B). Specifically, the diffusion of the ultraviolet absorber was evaluated on the basis of the change in reflectivity. The evaluation results are shown in Table 1.

Example 6

For a composition for back-side encapsulation sheet (D), 100 parts by mass of an ethylene polymer (density: 910 kg/m$^3$, MFR: 8 g/10 min at 190° C., 2.16 kg load) were mixed with 0.03 parts by mass of 2,5-dimethyl-2,5-bis(t-butylperoxy)hexane, 1.0 part by mass of vinyltriethoxysilane, and 0.3 parts by mass of a reactive ultraviolet absorber 2-[2-hydroxy-5-[2-(methacryloyloxy)ethyl]phenyl]-2H-benzotriazole to afford a resin composition.

The obtained resin composition was extrusion-molded into a sheet of the composition for back-side encapsulation sheet (D) having a thickness of approximately 600 μm using an extruder with a T-die. The diffusion of the ultraviolet absorber was evaluated in the same way as in Example 5 using the sheet of the composition for back-side encapsulation sheet (D). The evaluation results are shown in Table 1.

Comparative Example 1

A sheet of the composition for back-side encapsulation sheet (D) was prepared in totally the same way as in Example 1 except that the ultraviolet absorber was changed to 2-hydroxy-4-octanoyl benzophenone. The diffusion of the ultraviolet absorber was evaluated in the same way as in Example 1 using this sheet of the composition for back-side encapsulation sheet (D). The evaluation results are shown in Table 1.

Comparative Example 2

A sheet of the composition for back-side encapsulation sheet (D) was prepared in totally the same way as in Example 1 except that the ultraviolet absorber was changed to 2-(2-hydroxy-5-t-octylphenyl)-2H-benzotriazole. The diffusion of the ultraviolet absorber was evaluated in the same way as in Example 1 using the sheet of the composition for back-side encapsulation sheet (D). The evaluation results are shown in Table 1.

TABLE 1

|  | Ex. 1 | Ex. 2 | Ex. 3 | Ex. 4 | Ex. 5 | Ex. 6 | Comp. Ex. 1 | Comp. Ex. 2 |
|---|---|---|---|---|---|---|---|---|
| Initial reflectivity | 41.7 | 42.7 | 42.5 | 43.1 | 42.5 | 43 | 44.2 | 45.1 |
| Reflectivity after a lapse of 500 hr at 120° C. | 40.2 | 40.1 | 41.3 | 41.2 | 40.8 | 42.2 | 12.5 | 3.92 |
| % Reflectivity retention | 96% | 94% | 97% | 96% | 96% | 98% | 28% | 9% |

As shown in Table 1, the sheets of Examples 1 to 6 containing the reactive ultraviolet absorber had greater than 90% reflectivity retention after 500 hours. On the other hand, the sheets of Comparative Examples 1 and 2 containing the conventional ultraviolet absorber had reflectivity much smaller than the initial value after 500 hours and thus low reflectivity retention.

This indicates that the reactive ultraviolet absorber remains in back-side encapsulation sheet (D) and is prevented from diffusing into light-receiving-side encapsulation sheet (B). This also indicates that, by contrast, the conventional ultraviolet absorber diffuses from back-side encapsulation sheet (D) into light-receiving-side encapsulation sheet (B) over time. Thus, in the solar cell module of the present invention, light-receiving-side encapsulation sheet (B) has high reflectivity retention and as such is expected to minimize reduction in output (incident photon-to-current conversion efficiency) and have excellent durability.

INDUSTRIAL APPLICABILITY

A back-side encapsulation sheet for use in the present invention provides small diffusion of ultraviolet absorber. Specifically, the back-side encapsulation sheet for use in the present invention allows the solar cell module to maintain high output over a long period. Thus, this back-side encapsulation sheet can be used to provide a solar cell module having excellent durability.

REFERENCE SIGNS LIST

A1, A2 Glass sheet
B Light-receiving-side encapsulation sheet
C Aluminum sheet
D Back-side encapsulation sheet

The invention claimed is:

1. A solar cell module comprising:
   a surface-protective sheet;
   a light-receiving-side encapsulation sheet;
   a solar cell element;
   a back-side encapsulation sheet; and
   a rear protective sheet laminated in the order presented, wherein
   the light-receiving-side encapsulation sheet has 50% or higher transmittance of light having a wavelength of 300 nm, and
   the back-side encapsulation sheet comprises a reaction product of a reactive ultraviolet absorber and a resin component, wherein the resin component is an ethylene-polar monomer copolymer or an ethylene-$\alpha$-olefin copolymer and the reactive ultraviolet absorber contains a reactive functional group which is an unsaturated group having a carbon-carbon double bond which reacts with a molecular backbone of the ethylene-polar monomer copolymer or the ethylene-$\alpha$-olefin copolymer of the resin component.

2. The solar cell module according to claim 1, wherein the reactive ultraviolet absorber comprises a group selected from an acryloyl group, a methacryloyl group, and an allyl group.

3. The solar cell module according to claim 1, wherein the reactive ultraviolet absorber is at least one compound selected from 2-[2-hydroxy-5-[2-(methacryloyloxy)ethyl]phenyl]-2H-benzotriazole, 2-(4-allyloxy-2-hydroxyphenyl)-2H-benzotriazole, 2-(4-acryloyloxy-2-hydroxyphenyl)-2H-benzotriazole, and 2-(4-benzoyl-3-hydroxyphenoxy)ethyl propenoate.

4. The solar cell module according to claim 1, wherein an amount of the reactive ultraviolet absorber is 0.01 to 0.5 parts by weight with respect to 100 parts by weight of the ethylene-polar monomer copolymer or the ethylene-$\alpha$-olefin copolymer.

* * * * *